US008994370B2

(12) United States Patent
Pannetier-Lecoeur et al.

(10) Patent No.: US 8,994,370 B2
(45) Date of Patent: Mar. 31, 2015

(54) MAGNETORESISTOR INTEGRATED SENSOR FOR MEASURING VOLTAGE OR CURRENT, AND DIAGNOSTIC SYSTEM

(75) Inventors: Myriam Pannetier-Lecoeur, Bures sur Yvette (FR); Claude Fermon, Orsay (FR); Alain Giraud, Orsay (FR); Francis Roy, Les Ulis (FR)

(73) Assignees: Peugeot Citroën Automobiles SA, Route de Gisy, Velizy Villacoublay (FR); Commissariat a l'energie Atomique et aux Energies Alternatives, Paris (FR)

( * ) Notice: Subject to any disclaimer, the term of this patent is extended or adjusted under 35 U.S.C. 154(b) by 249 days.

(21) Appl. No.: 13/812,823

(22) PCT Filed: Jul. 28, 2011

(86) PCT No.: PCT/FR2011/051825
§ 371 (c)(1),
(2), (4) Date: Apr. 2, 2013

(87) PCT Pub. No.: WO2012/013906
PCT Pub. Date: Feb. 2, 2012

(65) Prior Publication Data
US 2013/0187645 A1    Jul. 25, 2013

(30) Foreign Application Priority Data

Jul. 30, 2010  (FR) ..................................... 10 56329
Jul. 30, 2010  (FR) ..................................... 10 56332

(51) Int. Cl.
*G01R 33/02* (2006.01)
*G01R 33/09* (2006.01)
*G01R 15/20* (2006.01)
(Continued)

(52) U.S. Cl.
CPC .............. *G01R 33/09* (2013.01); *G01R 15/205* (2013.01); *H01M 8/04537* (2013.01);
(Continued)

(58) Field of Classification Search
CPC .. G01R 15/183; G01R 15/202; G01R 15/207; G01R 15/14; G01R 15/20; G01R 19/0092; G01R 13/02; G01R 21/08; G01R 11/32; G01R 33/18; G01R 33/02; H01L 41/12; H01L 41/16; H02K 41/06
USPC ............... 324/252, 207.21, 207.13, 251, 260, 324/249, 244, 109, 235, 117 R, 117 H, 256, 324/389; 310/26, 311; 336/174, 175
See application file for complete search history.

(56) References Cited

U.S. PATENT DOCUMENTS 4,491,795 A  *  1/1985  Gelinas ......................... 324/248
4,937,521 A  *  6/1990  Yoshino et al. ............ 324/117 R
(Continued)

FOREIGN PATENT DOCUMENTS

DE            10113131 A1    9/2002
FR            2934419 A1     1/2010
WO          2006/136577 A1  12/2006

OTHER PUBLICATIONS

International Search Report from corresponding International Application No. PCT/FR2011/051825 mailed Dec. 13, 2011.

*Primary Examiner* — Huy Q Phan
*Assistant Examiner* — Thang Le
(74) *Attorney, Agent, or Firm* — Polster, Lieder, Woodruff & Lucchesi, L.C.

(57) ABSTRACT

The invention relates to an integrated sensor, including terminals (1, 2) for connection to an electric generator, said terminals being connected to a metal measuring line (4, 5) in which a current proportional to the voltage or current of the generator to be measured flows, and magnetoresistors (31, 32, 33, 34). The metal measuring line includes elongate and parallel sections (4, 5) in which the current flows in opposite directions, said sections being connected to a portion (3) for closing the metal measuring line (3, 4, 5), which is arranged on a galvanic isolation layer (8) that is in turn arranged on an integrated circuit portion including the magnetoresistors (31, 32, 33, 34), each of which have a sensitive portion that is vertically adjacent to one of the elongate sections (4, 5). The sensor can be integrated into a diagnostic system.

22 Claims, 10 Drawing Sheets

(51) Int. Cl.
*H01M 8/04* (2006.01)
*H01M 10/42* (2006.01)
*H01M 10/44* (2006.01)
*H01M 10/48* (2006.01)
*G01R 31/36* (2006.01)

(52) U.S. Cl.
CPC ....... *H01M 8/04858* (2013.01); *H01M 10/425* (2013.01); *H01M 10/44* (2013.01); *H01M 10/48* (2013.01); *G01R 33/093* (2013.01); *G01R 33/098* (2013.01); *G01R 31/3658* (2013.01); *Y02E 60/50* (2013.01)
USPC ................. 324/252; 324/207.21; 324/207.13; 324/251; 324/260; 310/26; 310/311; 336/174; 336/175

(56) References Cited

U.S. PATENT DOCUMENTS

| | | | |
|---|---|---|---|
| 5,465,049 A * | 11/1995 | Matsuura et al. | 324/248 |
| 7,394,240 B2 * | 7/2008 | Shoji | 324/142 |
| 2004/0155644 A1 | 8/2004 | Stauth | |
| 2005/0110464 A1 | 5/2005 | Baker | |
| 2006/0061350 A1 | 3/2006 | Myers | |
| 2006/0202692 A1 * | 9/2006 | Tatschl et al. | 324/252 |
| 2007/0170533 A1 * | 7/2007 | Doogue et al. | 257/422 |
| 2007/0279053 A1 * | 12/2007 | Taylor et al. | 324/252 |
| 2009/0140733 A1 * | 6/2009 | Koga et al. | 324/252 |
| 2009/0237085 A1 | 9/2009 | Suto | |
| 2011/0304327 A1 * | 12/2011 | Ausserlechner | 324/239 |

* cited by examiner

MAGNETORESISTOR INTEGRATED SENSOR FOR MEASURING VOLTAGE OR CURRENT, AND DIAGNOSTIC SYSTEM

CROSS-REFERENCE TO RELATED APPLICATIONS

The present application is the US National Stage under 35 U.S.C. §371 of International Application No. PCT/FR2011/051825, filed Jul. 28, 2011, and which claims priority to French Application No. 1056332, filed Jul. 30, 2010 and to French Application No. 1056329, filed Jul. 30, 2010.

BACKGROUND

This invention relates to a magnetoresistor integrated sensor for measuring voltage or current, such as gigantic magnetoresistors or tunnel magnetoresistors with considerable galvanic isolation, with the sensor comprising first and second terminals for connection to a generator for which the voltage or current is to be measured, the sensor connected to a metal measuring line through which flows a current proportional to the voltage or current of the generator which is to be measured, with said current flowing through this line creating a magnetic field measured remotely by the magnetoresistors.

This invention also relates to a diagnostic system for measuring the voltage or current of a power generator which can, among other uses, be carried on-board a vehicle for a dynamic application or be arranged in a static power generation facility and which may include multiple cells.

The invention applies in part to measuring the voltage of on-board power generators comprising multiple elementary cells such as fuel cells for automotive applications.

The domain to which this invention relates is the one of on-board electronic systems for reading, processing and transmitting of the measurement of multiple voltage sources operating in a severe environment. Further, the regulatory and safety requirements for an automotive application impose a galvanic isolation of 1500V between the unit of measurement and the source to be measured, with the galvanic isolation level being more generally defined by 2*U+1000 V RMS where U is the maximum operating voltage.

This technological need to measure multiple voltages has already been shown in patent document FR 2 934 419 A1. The technological solution shown in this prior art document is based on a principle of voltage/frequency conversion and the transmission of a binary signal through optocouplers ensuring the required galvanic isolation. However, this type of device requires a specific feed to ensure measurement. According to this document, the energy is directly drawn from the bipolar plates of the hydrogen and oxygen fed fuel cell.

In fact, various systems are known in which voltage measurements are conducted using intrusive devices that are used during the adjustment phase of the fuel cells. In this case, no on-board feed, nor measurement module are necessary since such devices do not permit performing a permanent diagnosis that interacts with the control/command of the fuel cell system for instance. In addition, for batteries that have a large number of cells, this means the presence of rather constraining cables for the environment of the battery and the use of intermediate boxes or of complex commercial or dedicated acquisition cards, for maintaining proper isolation between the battery and the measuring bench.

For the systems housed in the vehicle, the use of an on-board electronic system is known using mainly an analog-digital converter and an associated microcontroller to read, possibly to make a diagnosis and to transmit the digital data. In general, the galvanic isolation is controlled (>1500V). The system is fed by a DC-to-DC converter and the transmission of the data passes through an optoelectronic converter. This system, made up of a converter and a microcontroller, permits reading several multiplexed cells on the converter channel or channels, referenced to one and the same potential. This reading can be direct when the battery only consists of a small number of cells and as long as the voltage of the last cell remains compatible with the voltage supplied by the DC-to-DC converter. This is no longer the case when the number of cells becomes large. Then, the voltages of the various cells must be brought back by a resistor bridge to levels compatible with the features of the converter and manage numerous multiplexers with the inherent risk of channeling a large amount of information (presence of numerous potentials in the routing, crosstalk, accuracy, switching, . . . ).

The use of several DC-to-DC converters is also known from a source external to the battery (battery, feed, . . . ) in order to supply several feed sources of the parallel managed autonomous diagnostic systems. This method permits having several references available and regrouping the cells in packages each associated with a converter and a microcontroller. Such systems are heavily penalized by the size and the complexity of processing information.

The above systems are not fully satisfactory when one considers applications where the volume and reliability constraints become overwhelming, such as in the case of an automotive application that implies the following constraints among others:

Limited space,

Heat dissipation of the various modules,

Accuracy of the measurement of the voltages for each cell that may be affected by the presence of dividing bridges and switches used to measure voltages that are sometimes weak and fluctuating, Reliability of the measurement during the life of the vehicle, in spite of the component aging;

Compatibility of the principles of measurements and conditioning of the data with the CAN ("Controller Area Network") network of the vehicle.

In addition, the development of magnetoresistive sensors using giant magnetoresistors (GMR) or tunnel magnetoresistors (TMR) has been the object of intensive developments worldwide. The first application is the hard disks reading heads which are now manufactured with the help of this technology. The other applications are more recent and cover mainly position or angle sensors.

Recently, the NVE company (www.nve.com) launched the marketing of a current sensor consisting of a GMR bridge and a current line.

The Pannetier-Lecoeur, M.; Fermon, C; de Vismes, A, et al publication, JOURNAL OF MAGNETISM AND MAGNETIC MATERIALS Vol. 316, pages E246-E248 (2007) which describes a GMR current sensor is also a relevant reference.

The tunnel magnetoresistors (TMR) show not only a greater sensitivity than the giant magnetoresistors (GMR) but also more noise and a more difficult manufacturing process. They can be used beneficially in the case where operating temperatures must exceed 180° C.

SUMMARY

This invention is aimed at remediating the abovementioned inconveniences and to permit having an integrated sensor with considerable galvanic isolation available which permits voltage or current measurements for on-board generators and authorizes a compact and reliable implementation.

These goals are achieved, thanks to a magnetoresistor integrated sensor for measuring voltage or current, comprising first and second terminals for connection to a generator for which the voltage or current must be measured, connected to a metal measuring line, through which flows a current proportional to the voltage or current of the generator to be measured, and at least two magnetoresistors for measuring the magnetic field created remotely by said current flowing through said measuring line, wherein the metal measuring line comprises at least first and second elongated and parallel sections through which the current flows in opposite directions, connected to a section aimed at closing the measuring line, with all of the metal measuring line being arranged on one of the faces of an integrated galvanic isolation layer for voltages higher than or equal to 1500 V, with said integrated galvanic isolation layer being itself arranged on a section of the integrated detection circuit, with said circuit comprising as a minimum, these two magnetoresistors which each have a sensitive part which is essentially superimposed onto one of the elongated sections of the metal measuring line in order to be sensitive to the field created by the current flowing through the measuring line and in that each of the first and second elongated sections of the metal measuring line comprises a narrow part or constriction in an area near an area superimposed to a connecting path to a ground contact, with on the side of said first and second terminals, said narrow parts or constrictions being used as integrated fuse in case of an isolation defect created by an overvoltage peak.

Beneficially, all of the metal measuring line is arranged directly on one of the faces of the integrated galvanic isolation layer, and opposite the sensitive section of the magnetoresistors arranged directly on the other face of this integrated galvanic isolation layer, so that only the thickness of this isolation layer separates the measuring line from the sensitive element.

The magnetoresistors can be of the giant or of the tunnel type.

Preferably, said integrated detection circuit section comprises a magnetoresistor bridge and connecting paths to at least a Vdc voltage polarization contact, a ground contact and Vin− and positive Vin+ pole contacts of a differential output voltage.

Beneficially, each of the magnetoresistors is C-shaped with a longitudinal central branch that represents said sensitive part that is essentially superimposed onto one of the elongated sections of the metal measuring line in order to be sensitive to the field created by the current flowing through the measuring line.

Beneficially, in the case of giant magnetoresistors, each of the giant magnetoresistors has a length between 100 and 500 micrometers and a width between 2 and 8 micrometers.

Beneficially, in the case of tunnel magnetoresistors, each of these resistors has a free C-shaped layer with a length between 40 and 150 pm and a width between 2 and 8 μm and a hard layer formed by one or two blocks or pads of which the size is adjusted to obtain resistances situated between 300 ohm and 10 Kohm.

Preferably, the metal measuring line has a resistance between 30 and 100 ohm, which is adapted to currents of 5 and 100 mAmp taking into account the usual voltages to be measured.

Finally, the special configuration of the sensors and the current lines permits considering an integrated fuse function so that in case of an overvoltage that is too great or of an electrostatic discharge exceeding an adjustable threshold, the integrated current line can be used as an instantaneous fuse. For that configuration, each of the first and second elongated sections of the metal measuring line of each voltage or current measuring sensor, comprises a narrow section or constriction in an area near an area superimposed onto the connecting path to the ground contact, on the side of said first and second terminals, said narrow sections or constrictions being used as an integrated fuse in case of an isolation defect created by an overvoltage peak.

According to a preferred feature of the invention, the first and second elongated sections of the metal measuring line show a width comparable to that of said sensitive sections of the magnetoresistors.

According to another aspect of the invention, the galvanic isolation layer is flat and has a thickness between 5 and 15 micrometers, where the thickness is linked to the desired galvanic isolation and the nature of the isolating material chosen.

According to an illustrative embodiment, the galvanic isolation layer is made up of a hardened resin deposit.

In this case, the galvanic isolation layer may include a polyimide or bisbenzocyclobutene (BCB).

According to another embodiment, the galvanic isolation layer is made up of a ceramic isolating product deposit.

In this case, the galvanic isolation layer may include a layer of $Si_3N_4$ or $Al_2O_3$.

The integrated sensor according to an embodiment of the invention can be applied for measuring the voltage or current of a generator comprising a fuel cell with an output voltage between 0 and 1.3 V.

The Vdc voltage polarization contact and the ground contact can be connected to an electric feed battery with a voltage between 1 and 12 V. The resistance of the GMRs will then be chosen so that the current flowing through them does not exceed 1 mAmp per pm of width of the GMRs. In the case of the TMRs, the voltage polarization must be selected to obtain about 0.4 V on each block or pad of the TMR.

Consequently, the proposed embodiments resolve several serious problems that remained unsolved with the prior art work.

As such, this invention permits having a considerable galvanic isolation between the current line and the magnetoresistor bridge while defining a fully integrated sensor. While distances in millimeters are generally used, the proposed technology permits having current lines typically located at 8 μm from the GMR bridge.

The size and the makeup of the magnetoresistor bridge selected permit obtaining linearity features that are compatible with the specifications required for the intended application.

Also, using a longitudinal polarization field permits improving this linearity. This technique is the object of a prior patent application publication (WO2007 148028).

In addition, use of tunnel magnetoresistors permits obtaining a configuration with a very low power consumption.

The invention also relates to a voltage or current measurement diagnostic system for a power generator, that includes at least a hybrid measuring module that comprises multiple giant magnetoresistive sensors for measuring voltage through a current or for measuring current as defined above, integrated on one and the same strip, an amplification module comprising several amplifiers which receive signals delivered by said multiple sensors, a multiplexing module, a connection device and a separate digital processing module.

According to a beneficial feature of the invention, the hybrid measuring module includes a first printed circuit containing said strip of sensors and the amplification module and a second printed circuit containing the multiplexing module, with signal exchange paths formed on the printed circuit sections, and the first and second printed circuits being assembled, molded and encapsulated with the input-output connection terminals linked to said signal exchange paths formed on the printed circuit sections and connected to said liaison device.

The processing module can include at least one processing unit, analog inputs and analog-digital converters, TOR inputs-outputs of the all or nothing type and a printed circuit ensuring all of the liaisons between the hybrid measuring module and the processing module.

According to a preferred embodiment, each integrated giant magnetoresistor sensor for measuring voltage or current includes first and second connection terminals to an individual cell of the generator for which the voltage or current is to be measured and a metal measuring line comprising first and second elongated and parallel sections through which the current flows in opposite directions, linked to a section used to close the measuring line, with the measuring line unit situated on a galvanic isolation layer, itself situated on an integrated circuit section that comprises a giant magneto resistor bridge and connecting paths to at least one Vdc voltage polarization contact, a ground contact and negative V− and positive V+ pole contacts of a differential output voltage, with the giant magnetoresistors being themselves C-shaped with a longitudinal central branch forming a sensitive magnetoresistor section which is essentially superimposed onto one of the elongated sections of the measuring line.

In addition, the system can also include a resistor situated between a measuring point of each power generator cell and the corresponding input terminal of the sensor strip, in order to extend the voltage measuring range without reconfiguring the whole system.

According to an illustrative embodiment, and given as an example, each strip includes eight giant magnetoresistor sensors for measuring voltage or current; the amplification module also includes eight amplifiers and the multiplexing module comprises at least three layers with seven elementary multiplexing cells activated by three selection signals.

An initial offset compensation circuit can be associated with each amplifier.

According to another particular feature, a polarization point compensation circuit determining a floating ground can be associated with each amplifier.

The system according to the invention is beneficially applied for measuring the voltage or current of a generator with multiple fuel cells that have an output voltage between 0 and 1.3 V and more generally, of any generator comprising multiple cells with a voltage that can be brought back to a range between −1.2 V and +1.2 V.

The proposed invention permits resolving several important problems that remained unsolved in the prior art work.

For instance, the modular system design permits an easy implementation, it facilitates an adaptation for generators with a large number of elementary cells and minimizes the external noise sources originating mainly from connectivity.

The invention also permits having an important galvanic isolation between the current line and the GMR resistor bridge while defining a fully integrated sensor. While millimeter distances are generally used, the proposed technology permits having current lines situated typically at 8 μm from the GMR bridge.

The size and makeup of the GMR bridge selected permit obtaining linearity features compatible with the specifications required for the intended application.

According to the intrinsic feature of the invention, the use derived from an external feed source, such as the vehicle battery for automotive applications, from the GMR resistor bridge, simplifies instrumentation unit design required for such a bridge, and overall of the associated processing modules.

The particular configuration of the sensors and of the current lines permits implementing an integrated fuse function which in case of a very high overvoltage or of electrostatic discharge exceeding 2 kV, the integrated current line can be used as an instantaneous fuse.

BRIEF DESCRIPTION OF THE DRAWINGS

Other features and benefits of the invention will appear from the following description of the particular modes of embodiment, given as examples, referenced against the attached drawings, for which.

DETAILED DESCRIPTION

The "Giant Magnetoresistive effect" (GMR effect) and the Tunnel Magnetoresistive Effect (TMR effect) are observed in thin metal films made up of ferromagnetic and non-ferromagnetic material layers. It manifests itself by a considerable variation of the electric resistance of these structures in the presence of a magnetic field. The usual configuration of a magnetoresistor is a spin valve made up of a hard layer (insensitive to magnetic field) and a free layer which rotates freely in the magnetic field. The resistance of this system changes on the basis of the angle between the hard layer and the free layer. In the case of the GMRs, the two layers are separated by a metal layer and the measuring contacts attach to the top of these layers. In the case of the TMRs, the two layers are separated by an isolating layer and the measuring contacts attach to the bottom and to the top of the layers.

For the sensors used in some embodiments of this invention, the preferred configuration is to have the orientation in the absence of the magnetic field of the free layer perpendicular to the direction of the blocked layer. This is done on the one hand by using the shape of the sensor, on the other hand by applying a controlled polarization field ("bias"). The direction of the blocked layer is obtained by annealing under a strong magnetic field, typically at 260° C. and 0.1 T for a few minutes.

Figure 1:
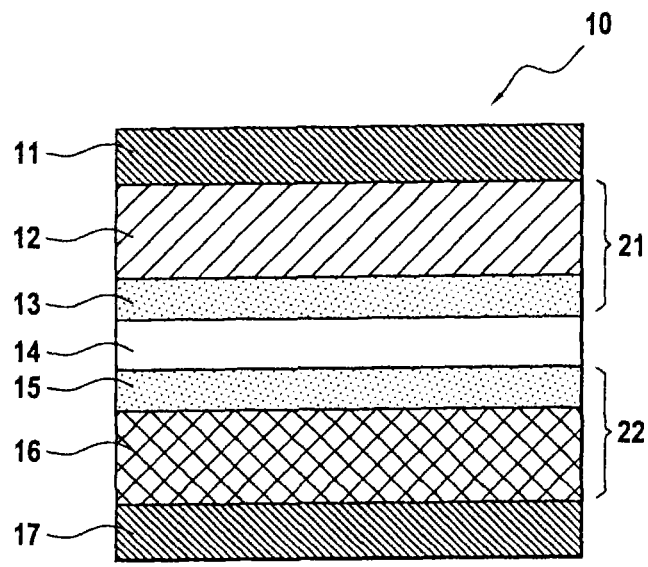
FIG. 1 is a schematic sectional view showing as an example the elements making up a magnetoresistive sensor of the GMR or TMR spin valve type.

FIG. 1 shows a representative example of this assembly of thin films that constitutes a magnetoresistive sensor 10 of the GMR type having the structure of a spin valve, and which is described for instance in document Fr 2876800.

A spin valve typically contains a hard or blocked layer 22, in other words, a layer with little sensitivity to the outside magnetic field and a soft or free layer 21, which is very sensitive to the magnetic field.

Hard layer 22 can be made up of an assembly of ferromagnetic layers having a strong coercivity, or a mixture of anti-ferromagnetic layers, artificial or not, coupled to a ferromagnetic layer.

The soft layer is made up of very soft magnetic materials.

As an example, the magnetoresistive sensor 10 of FIG. 1 can include, starting with the free surface, a tantalum protective layer 11, a soft magnetic layer 21 comprising an NiFe layer 12 and a CoFe layer 13. This soft layer 21 is turned in the direction of the outside magnetic field.

A hard magnetic layer 22 is separated from the soft layer 21 by a separating copper layer 14. The hard magnetic layer 22 can include, starting with separating layer 14, a CoFe layer 15 and an IrMn layer 16. Hard layer 22 has a direction of magnetization installed during manufacturing. A tantalum layer 17 can be used as growth precursor of higher layers added for implementing the circuit.

For example, all of the sheets of FIG. 1 can have a thickness of about 30 nm, while the dimensions of the cell unit can be typically 200 µm×30 µm×5 µm.

As was explained in the publication, "Low noise magnetoresistive sensors for current measurement and compasses", Pannetier-Lecoeur, M; Fermon, C; de Vismes, A, et al., JOURNAL OF MAGNETISM AND MAGNETIC MATERIALS, VOLUME 316, Issue: 2; pages E246-E248, published in 2007, the use of C-shaped sensors permits the strong reduction of magnetic noise. In addition, application of a longitudinal magnetic field permits for perfectly controlling the response of each GMR sensor. Consequently, these optimized configurations are being retained.

Figure 2:
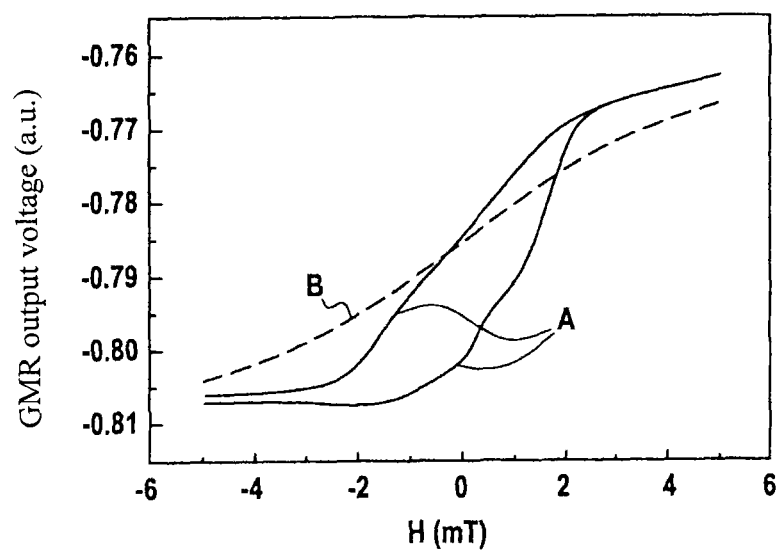
FIG. 2 shows a typical response curve of a GMR sensor, such as for instance the one of FIG. 1, without and with respectively optimization of the configuration.

FIG. 2 shows a typical response (output voltage) of a spin valve on the basis of the applied field H in a case where the shape and the polarization field are not optimized (curve A) and in the case, where they are optimized (curve B).

Figure 3A:
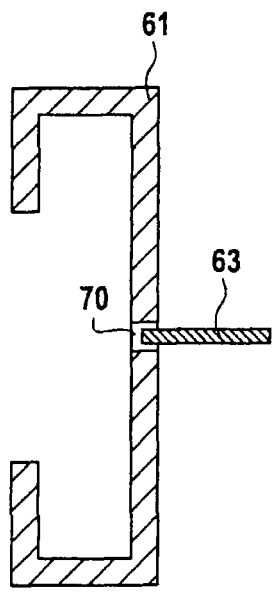
FIGS. 3A and 3B are schematic views of the configurations of a tunnel magnetoresistor showing how contacts are established according to two variants of an embodiment.
Figure 3B:
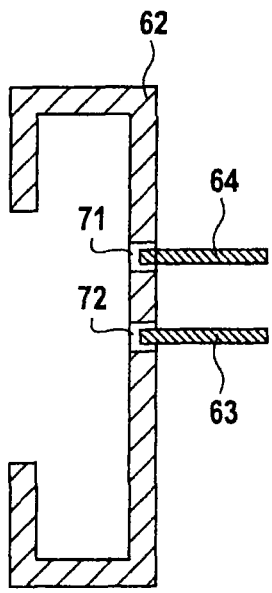

FIGS. 3A and 3B show measuring configurations of a tunnel magnetoresistor. FIG. 3A corresponds to a configuration with a single magnetoresistor block or pad 70 while FIG. 3B shows an embodiment that corresponds to a configuration with two magnetoresistor blocks or pads 71, 72. The two-block configuration is beneficial because it permits doubling the acceptable voltage at the magnetoresistor terminal and consequently, having twice as much sensitivity.

On FIG. 3A, one observes a C-form cylinder head 61 in the free layer of a TMR corresponding to the bottom contact and a second measuring contact 63 of the TMR located on top, at the level of block or pad 70.

On FIG. 3B, one observes a C-shaped cylinder head 62 in the free layer of a TMR without contacts. A first measuring contact 64 of the TMR is situated on top at the level of block or pad 71 and a second measuring contact 63 of the TMR is located on top, at the level of block or pad 72.

Figure 4:
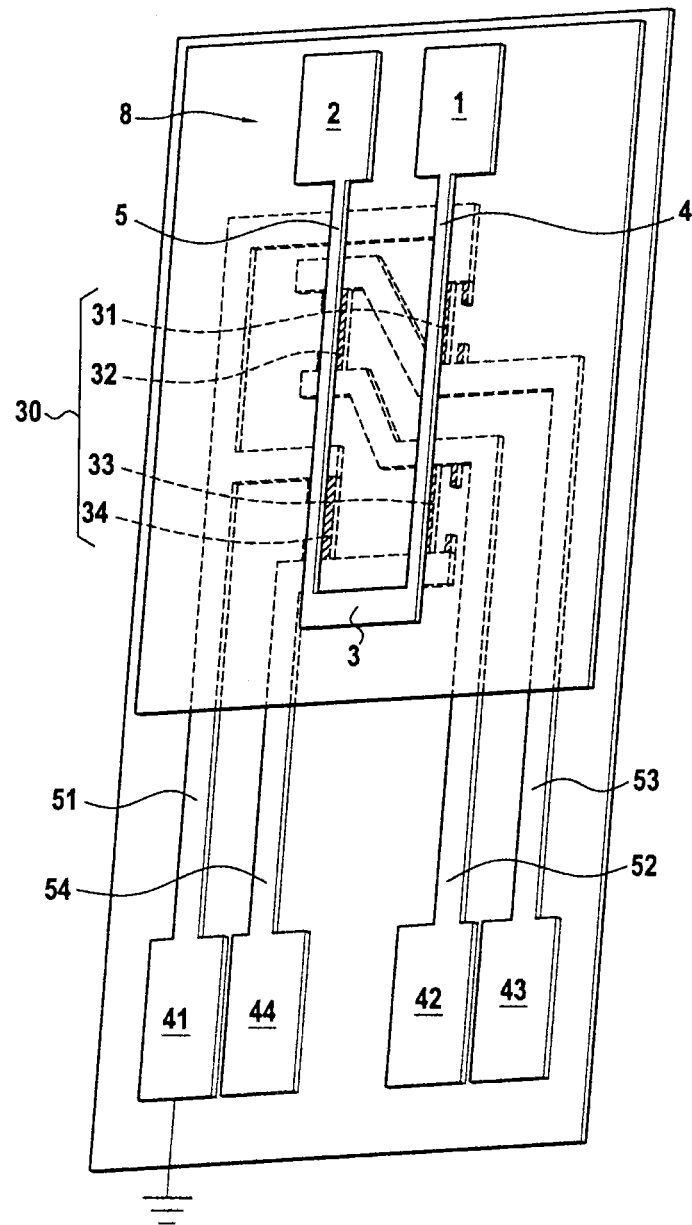
FIG. 4 is a schematic view of a possible particular embodiment of a configuration comprising an integrated GMR sensor, a measuring bridge and a metal measuring line.
Figure 5:
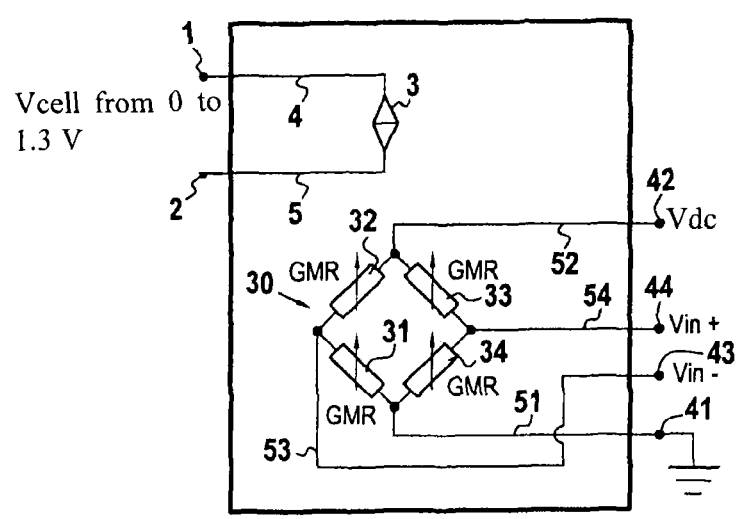
FIG. 5 is a schematic view of an electric circuit of the integrated sensor of the embodiment of FIG. 4.
Figure 7:
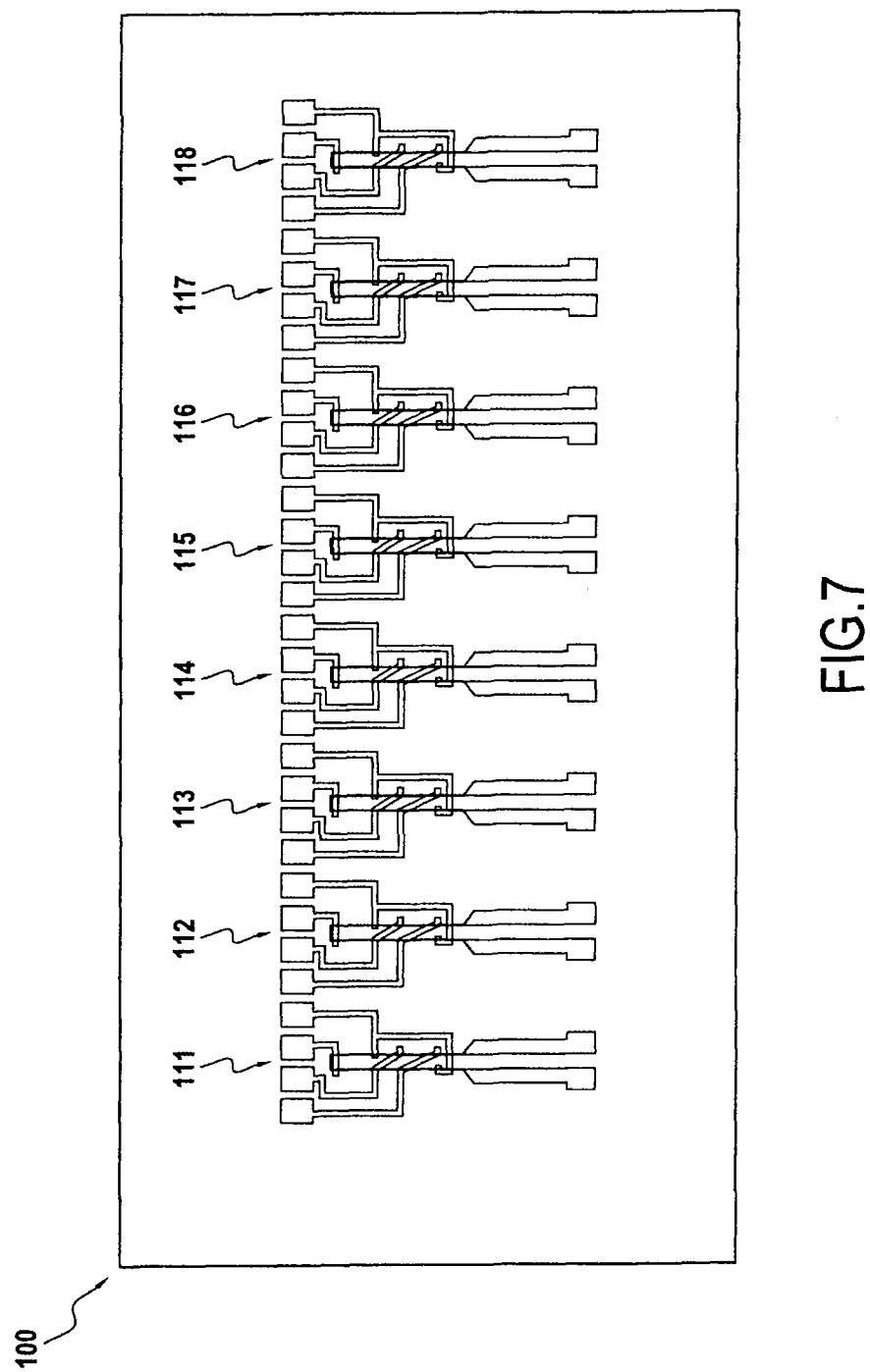
FIG. 7 is an overhead schematic view showing a measuring strip in which multiple measuring sensors are integrated while implementing GMR type magnetoresistance sensors.

FIGS. 4 and 5 illustrate the principle for integrating the GMRs in the sensor, which can be an individual sensor 111 to 118 itself integrated in a strip 100, as shown in FIG. 7.

For this application, polarization is imposed by the feed at a constant voltage between the Vdc voltage and the ground. A GMR cell 30 includes four GMRs 31, 32, 33, 34 mounted on a bridge. The current of each of the branches of the bridge is proportional to the resistance of the GMRs, and consequently to their variation in the presence of a field, which is the principle of the cell voltage measurement.

FIG. 4 represents an example of a GMR cell with a complete bridge 30 comprising four GMRs, a galvanic isolation layer 8 and a metal measuring line, with first and second terminals 1, 2 for connection to a generator for which the voltage or current is to be measured and a metal measuring line comprising the first and second elongated sections 4, 5 connected to a section 3 situated transversally with respect to the first and second sections 4, 5 and aimed at closing the measuring line. Measuring line unit 3, 4, 5 is situated on the galvanic isolation layer 8 which itself is located on an integrated circuit section comprising the giant magnetoresistor bridge 30 and paths 52, 51, 53, 54 connected to at least one Vdc voltage polarization contact 42, a ground contact 41 and contacts 43, 44 with negative Vin− and positive Vin+ poles with a differential output voltage.

The giant magnetoresistors 31, 32, 33, 34 are themselves C-shaped with a longitudinal central branch which is essentially superimposed onto one of the elongated sections 4, 5 of the metal measuring line. It is important to note that all GMRs respond identically to the outside magnetic field which implies that an outside magnetic disturbance does not unbalance the bridge. On the other hand, since the metal measuring line includes two segments aligned with the GMRs through which run currents in opposite directions, its action is opposed and consequently, the appearance of a current in the metal measuring line creates a bridge unbalance.

FIG. 4 shows an electric bridge assembly as implemented in the invention to guarantee optimum accuracy while undoing itself from the recurring interference fields (earth, environment, . . . ). FIG. 5 shows the bridge operating mode.

At this time, some considerations will be given to the calculation of the system response.

The cell voltage VCELL creates an IBIAS current according to the formula $$I_{bias} = V_{cell}/R_{current\ line}$$

Starting with $I_{bias}$, one can determine the magnetic field seen by the GMR sensors. It can be expressed as: $B = \pi \cdot i_{him}$ where parameter a depends of the size of the GMR resistors, of the size of the current line and of the distance between the GMR resistors and the current line.

Sensitivity is determined from the GMR resistor (RGMR). As a first approximation, the variation of the ARGMR resistor in the presence of a magnetic field is a linear function of this field. The variation is typically $$\frac{\Delta R * GMR}{^\wedge GMR} = 0.02\ B$$

where B is expressed as mT.

For a bridge assembly as shown in FIG. 5, the differential output voltage is calculated on the basis of the values given above. The GMR resistors are designed to be as homogeneous as possible. They are situated on top of the current line so as to be able to be sensitized by an opposite magnetic field. This permits increasing the sensitivity of the bridge and eliminating surrounding interference fields (earth field, . . . ). By admitting that the variation of the RGMR resistors is homogenous and equal to ΔRGMR, the transfer equation can be expressed as: $Vin_+ - Vin_- = Vdc * AR_{gmr}/R_{gmr}$ Since the different transfer coefficients are linear or nearly linear as a first approximation, one deduces that $Vin_+ - Vin_-$ is proportional to the VCELL cell voltage.

The differential voltage delivered by this transducer remains weak and is characterized by two main parameters, the offset between the branches of the bridge when no voltage is delivered by the cell (called OFFSET) and the dynamic coming from the sensitivity of the transducer in the presence of the magnetic field arising out of the presence of voltage at the cell terminals.

The offset is essentially introduced by a non-homogeneity of the four resistors forming the bridge, with the dynamic being itself more associated with the technology of the transducer materials.

The typical sensitivity of a GMR cell is 50 mV at the terminals of the bridge for a voltage of 1.3 V, with a linearity better than 1%. The offset depends on the manufacturing quality, but preferably must be less than 20 mV.

Noise of the system after optimization of the sizes and shapes of the sensor is mainly linked to the low frequency noise of the GMR elements. The integrated noise on a band from direct current to a frequency of 100 Hz is typically 50 nV RMS, which gives a voltage noise at the level of measurement of 1.4 pV RMS.

Now the principle of optimizing sizes and sensor shapes will be pointed out.

The metal measuring line 3,4,5 is connected to the fuel cell for which voltage is measured, or to any other generator of the same type, is separated from the GMR measuring bridge 30 by an isolation layer 8, and is optimized to ensure the galvanic isolation required for an automotive application, namely 1500 V.

The bridge feed 30 can consequently be obtained by a stabilized external source. Use of 3.3 V or 5 V source is often used to have a direct compatibility with the standard electronic circuits.

One observes that this sensor provides for two basic functionalities for the application of this invention:

Ensure the role of transducer by having a traditional output of a measuring bridge (Vin+−Vin−) directly providing a proportional value of the measure fuel cell voltage, Ensure the galvanic isolation as close as possible of the measurement, avoiding the integration in the acquisition chain of the specific stages of conditioning of the signals to ensure the 1500 V galvanic isolation (contrary to the prior art devices requiring the implementation of a time-frequency conversion and optocouplers for instance).

In addition, the design of the metal measuring line lends itself to a very beneficial embodiment, illustrated in FIG. 6 and described below, where this current line provides for a fuse function which auto-protects the fuel cell in case of excessive current at the measuring cell level.

The auto fuse function is ensured by the integration in the measuring line of at least a narrowing or micro-constriction 6, 7 which serves as a fuse in case of an isolation default created by an overvoltage peak.

Figure 6:
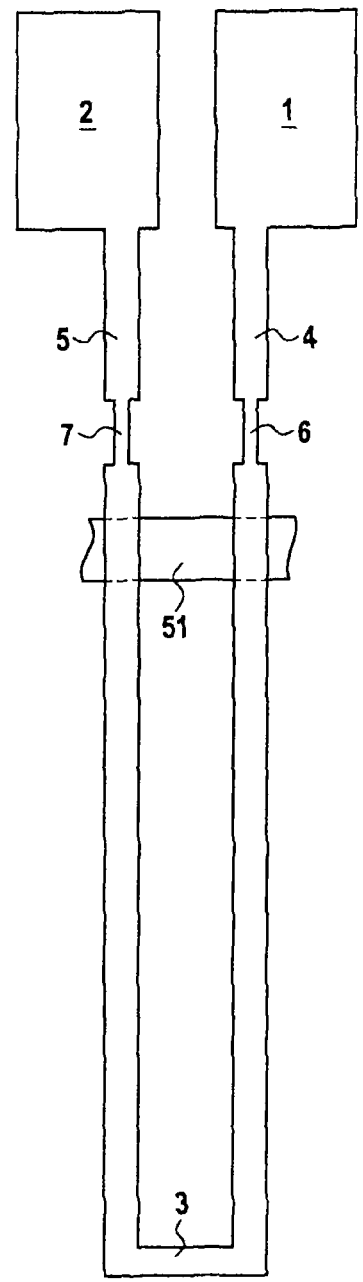
FIG. 6 is a partial diagram of an integrated sensor with an embodiment variant of the measuring current line containing an integrated fuse function.

Ground feed line 51 passes under the metal line as shown in FIGS. 4 and 6. In the vicinity of this passage point, elongated sections 4,5 of the metal line contain a narrowing or constriction 6,7 that is slightly offset in the direction of connection terminals 1, 2. In case of an overvoltage peak initiating a disruptive breakdown and consequently a connection risk between the cell feed and the low voltage circuit of bridge 30, the offset constriction 6, 7 vaporizes and isolates the measuring component, serving as an auto-fuse.

A certain number of parameters permit defining the optimal structure to have the desired linearity and the dynamic measurement for in an integrated sensor according to the invention.

Optimization of the size and the shape of the GMRs are based on several criteria:

The resistance measured, of 500 ohm per bridge arm. This determines GRM lengths of 200 μm by 5 μm in width, knowing that the resistance per square surface of a GMR stacking is about 12 ohm. In the case of TMR, the surface of the block or pad determines the resistance. A resistance of 500 ohm is also intended.

The width of the GMR or TMR is preferably chosen between 4 pm and 8 μm. This ensures a sufficient linear response before applying a polarization field but smaller widths may be selected if the voltages to be measured are higher.

The magnetoresistors have a C-shape (see FIGS. 3A and 3B) so that the magnetic noise is reduced in the measuring zone.

An important point is that the GMR must be manufactured to ensure a bridge offset below 1%.

It must be pointed out that the intrinsic response of the GMR and TMR magnetoresistors shows a sensitivity variation of about 8% over the temperature range. This sensitivity variation must be compensated for by sizing the longitudinal stabilization field, if for instance it is created by a permanent magnet which has a field decrease of the same order over the desired temperature range.

The choice of size and thickness of the current line is made with the following criteria:

Resistance of the metal measuring line must be adjusted so that the 1.5 V voltage delivers 20 mAmp, for example. This corresponds to a resistance of 75 ohms. Current values between 5 and 30 mAmp are preferably chosen to minimize the current drawn from the battery and to minimize the power dissipated in the component while maintaining a sufficient sensitivity with respect to the desired resolution.

The resistance of the line is given by the width of the line and by its thickness. Preferably, one shall select a line width that is comparable to and larger than the width of the magnetoresistors. A width that is too small (less than 3 μm) will induce a lesser reproducibility of the resistance. A width that is too large will hamper the sensor response. Widths between 4 μm and 20 pm are preferred.

The designed solution is determined by the noise of bridge 30 of the magnetoresistors. At low frequency, the latter is dominated by resistance fluctuations that have a spectral density of 1/f. For a bridge drawn according to the size and shape criteria defined above, the noise is about 25 nT RMS. With a current line width equal to the width of the constriction and an isolation thickness of 5 μm, this corresponds to a current detectability of 10 μA, The quality and flatness of the galvanic isolation layer 8 is a crucial point for the performances of the device. The layer must be sufficiently thick to ensure the galvanic isolation required (1500 V to 3000 V) and sufficiently flat so that the growth of the measuring line 3, 4, 5 and its link to the outside world (connection terminals 1, 2) is feasible.

Taking into account the integrated nature of this insulating material, the current line is directly arranged on one of its faces and the C-shaped magnetoresistor on the other face, with its sensitive section situated directly opposite. Consequently, the galvanic isolation is obtained directly by multiplying the thickness of the support by the isolation capacity of material of this support.

For instance, in a preferred embodiment, which results in very flat layers and with good dielectric resistance, one uses a layer of $Al_2O_3$ deposited by cathodic pulverization with Argon+Oxygen vapor. The galvanic isolation is 400 V per pm deposited.

The dual "integrated galvanic isolation" and "thickness of less than or equal to 8 pm" feature, taking the integration into account, requires that the current line/magnetoresistor distance is also 8 pm maximum. Likewise, a support of 6 μm provides a theoretic isolation of 3200 V and a practical isolation which exceeds 2000 V. This technique permits obtaining layers of very good quality but with relatively long deposit times. An alternative is to deposit $Al_2O_3$ by another technique, the "Plasma Enhanced Chemical Vapor Deposition" (PECVD) which also gives good results with shorter deposit times.

One might also consider insulating supports based on deposits of hardened resins (poly-imides, BCB (Bisbenzocyclobentene) for instance) or deposits of ceramic insulating materials ($Si_3N_4$, $Al_2O_3$ for instance). The dielectric resistance results from the known dielectric properties of these materials and the thickness of the support.

The development of magnetoresistor current sensors permit very integrated solutions and an unequaled resolution. In particular, the integrated galvanic isolation permits attaining resolutions of 10 μA, while existing automotive sensors are typically in the range of mAmp or even 10 mAmp. In addition, existing automotive sensors do not allow implementing the auto fuse function described above.

The combination of the C-shape of the sensors and of this weak current line/magnetoresistor distance defines two features that very significantly improve the signal-to-noise ratio and thus, their combination is particularly beneficial. In addition, it has been indicated above that this integrated isolation allows for the implementation of the auto-fuse function.

Generally, one can point out that the integrated isolation simultaneously produces a strong isolation and a yields a very small distance between the current line and the magnetoresistor. Reconciling these two contradictory features yields a much higher S/N (signal-to-noise) ratio than for embodiments found in the prior art.

The GMR and TMR technology, as applied to motor vehicles has among other the following features:
Technology for measuring voltages (positive and negative) with great accuracy (typically 10 mV) and precision ensured by calibration,
Technology permitting intrinsic measurement of the current,
Certainty of operation of the cell diagnostic device ensured intrinsically by magnetoresistors,
Galvanic isolation ensured by the sensor itself,
The sensor provides an overcurrent fuse,
Measurement accuracy technology well adapted to the measurement of the weak currents compared to Hall effect sensors, which are the sole competing current measurement components,
A compact implementation which is simple to integrate, in particular for on-board motor vehicle applications,
Possibility of directly connecting the integrated components to the fuel cell,
Accuracy of the measurements, even in a severe environment with electromagnetic disturbances,
Technology that can be integrated on a chip with low manufacturing cost as compared to partially competing technologies, which result from a very wide application field that allows high volume production,
Low power consumption (<to 1 mAmp per bridge), excluding consumption of the current line in the polarization resistor 3, for which adjustable consumption is required,
An autonomous voltage measurement sensor that does not required related components to perform the function (external current line, cable, . . . )
Wide application within the automotive sector in electric and hybrid vehicles (combustion/electric, . . . ), since the sensor can make all necessary current or voltage measurements of an electric generator,
Application for managing battery or super capacity charges,
Monitoring of the individual fuel cell voltage,
Applicable to electrolysers,
Instrumentation/diagnostic applicable to any electrical engineering technology requiring current/voltage measurement(s).

The elementary cell of the sensor as described above, and shown in FIG. 4, can be duplicated on one support to integrate a number of measurement paths.

FIG. 7 shows a strip 100 integrating eight elementary cells of a giant magnetoresistive (GMR) measuring sensor 111 to 118. The provision of eight cells is practical and compatible with manufacturing methods similar to those pertaining to microelectronic components but the invention is of course not limited to such a number of elementary cells.

For example, the strip of FIG. 7 includes eight elementary measuring cells that have a surface area of 4×13 mm.

However, the methods used for the embodiment of strip 100 have shown the existence of an offset signal between the branches of a same GMR cell in the absence of cell voltage and of a dispersion between cells affecting this offset, and also a variance in the differential voltage compared to that measured when a voltage is applied to the cell.

These parameters depend on the technologies used and of the GMR cell manufacturing method.

For the target application, +/−60 mV was chosen for the offset of branches and +/−80 mV was chosen for the dynamic of the GMR cell. The V+−V− voltage can consequently vary on the average between −140 mV and +140 mV.

Stabilization and homogeneity of these parameters can be improved if the transducer is manufactured according to an industrial method comparable to those implemented for the electronic components.

Strip 100 provides analog signals coming from the GMR cells with very low amplitude. Consequently, it is necessary to add specific stages, such as, at a minimum, amplification 200 and multiplexing 300 before converting the analog signal into a digital data compatible with an on-board computer 400.

Figure 8:
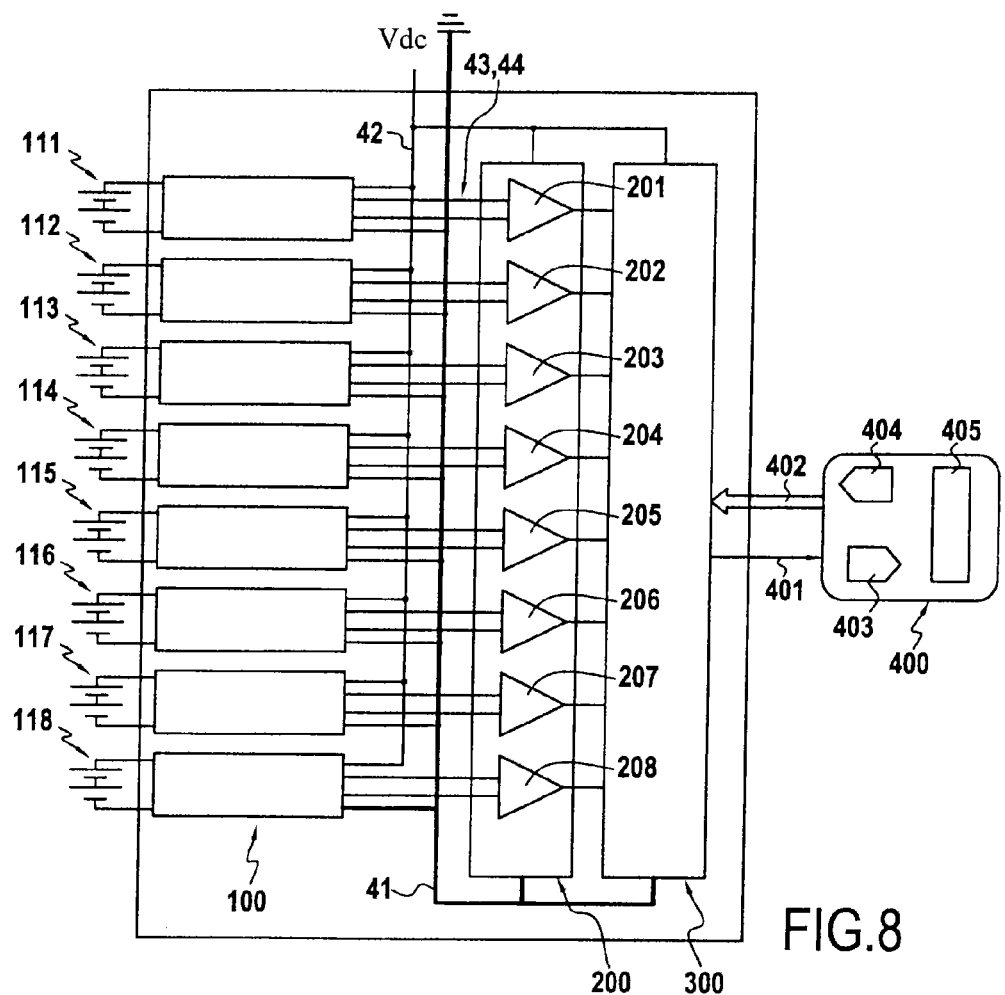
FIG. 8 is an elementary synoptic diagram of the overall diagnostic system according to an embodiment of the invention.

The synoptic diagram of FIG. 8 repeats these different functional blocks 100, 200, 300 and 400.

FIG. 8 shows a GMR strip 100 made up of 8 structures grouping GMR cell 111 to 118 and its associated amplification module 201 to 208.

As a first approximation, it can be said that the dynamic of 80 mV corresponds to a variation of the battery cell voltage between 0 V and 1.3 V. Therefore, the amplification stage 200 must have a gain of 10-15 to deliver a comparable voltage in a ratio close to 1 with the battery cell voltage.

A path selection module 300 permits multiplexing for reading to an outside module 400, for example, the 8 paths of strip 100 on an output path 401.

Figure 9:
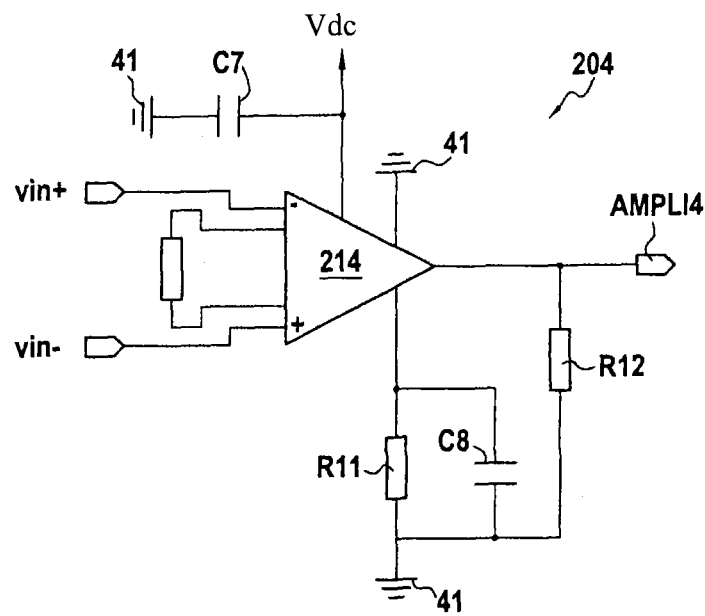
FIG. 9 is a diagram of an amplification elementary cell that may be used in an embodiment of this invention.

The electronic diagram of FIG. 9 shows an example of an amplification cell (cell 204 is shown, and is representative of the other cells 201 to 203 and 205 to 208) made up of a U4 instrumentation amplifier adapted to the signals delivered by the corresponding GMR cell (here, cell 114 connected by terminals 4Vin+ and 4Vin− to amplifier U4). This component functions according to the usual voltage ranges of present CMOS components, either for the selected component, a 0-3.3V single voltage feed. Gain G is defined by the formula G=2*R11/R10.

VIN+ and VIN− inputs correspond to differential outputs 44 and 43 of the GMR bridge 30.

The AMPLix signal is the signal amplified by the amplification cell. It is defined by AMPLix=G*(VIN+−VIN−).

Figure 10:
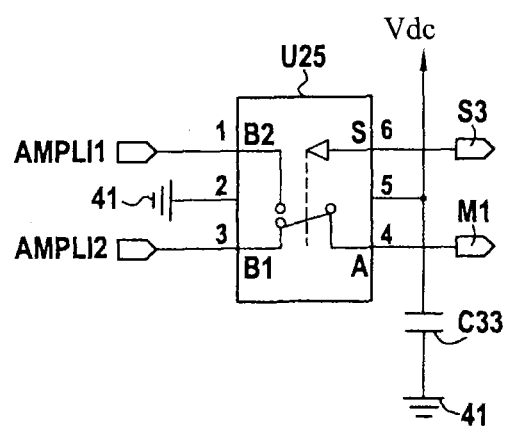
FIG. 10 is a diagram of a multiplexing elementary cell that may be used in an embodiment of this invention.

Elementary multiplexing cells U25, shown in FIG. 10, which are selected from a technology compatible with the signals delivered by the amplifier preceding it (here amplifiers 111 and 112 for the first elementary multiplexing cell U25 of FIG. 10), multiplexes two paths into one. This assumes that to read the eight paths of GMR strip 100 of FIGS. 7 and 8, the selection module includes three stages ($2^3$ or 8) which permits the selection of 4 paths, then 2 paths, then one.

Figure 11:
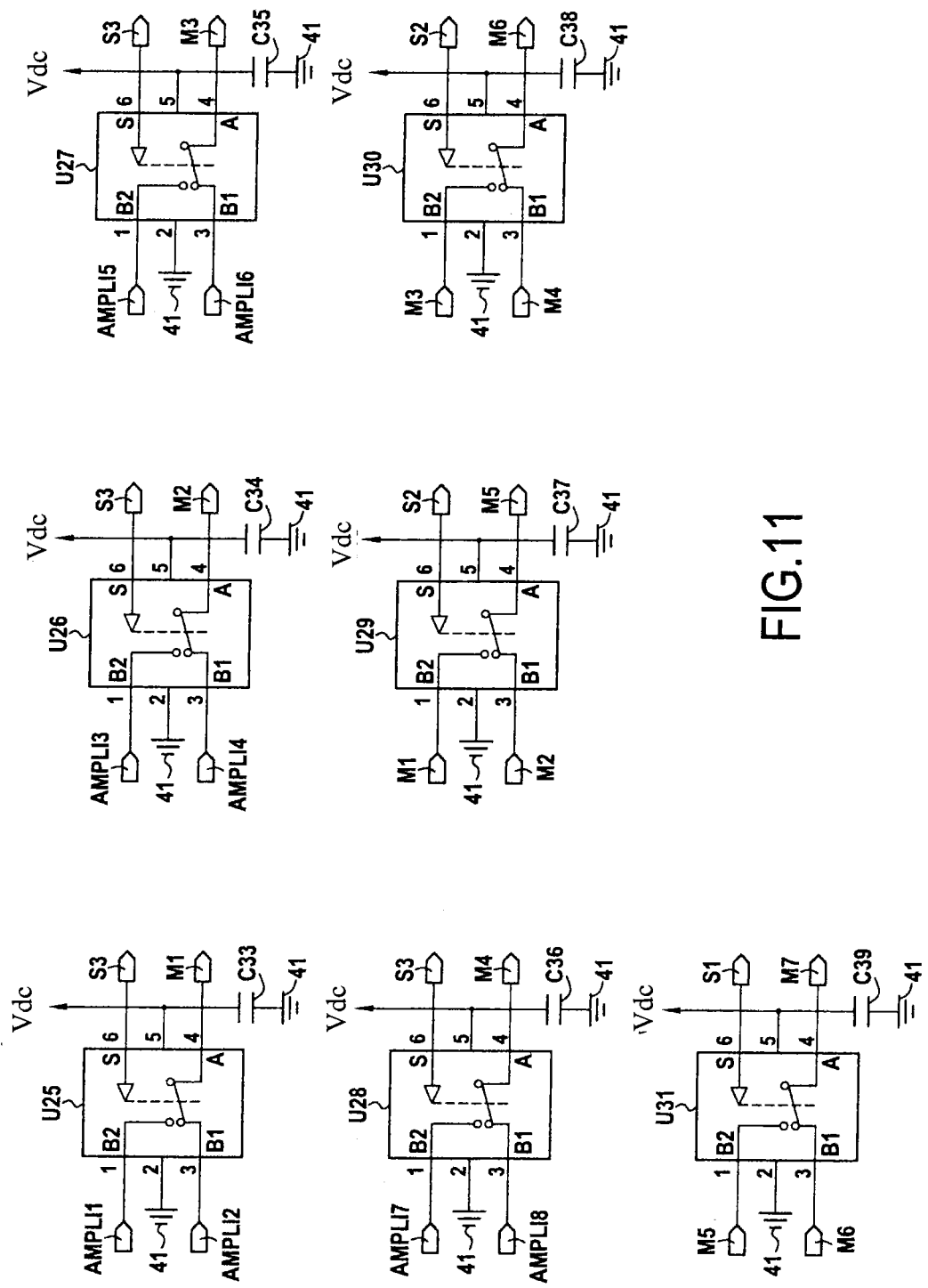
FIG. 11 is an example of a multiplexing module that may be used in a particular embodiment of the invention.

As is shown by FIGS. 10 and 11, signal S3 allows selecting outputs AMPLI1 and AMPLI2 towards selected signal M1, for the first elementary multiplexing cell U25.

Consequently, selection module 300 includes seven elementary multiplexing cells (U25 to U31), activated by three selection signals Si acting on each of the stages (FIG. 11).

Signal S3 permits selecting among the eight AMPLI1 outputs, four intermediate signals Mj ($1<=j<=4$) forming the inputs of the second stage. Signal S2 permits selecting among signals Mj two intermediate signals Mk ($5<=K<=6$) forming the inputs of the third stage. Signal 51 allows the AMPLIi output to be selected from signals Mk (final signal M7) which is sent to the external module 400. Consequently, the elementary multiplexing cells U25 to U28 constitute the first stage, the elementary multiplexing cells U29 and U30 represent the second stage and the elementary multiplexing cell U31 represents the third stage.

Figure 12:
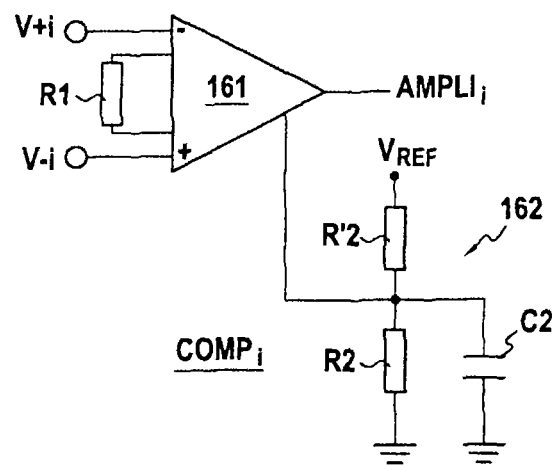
FIG. 12 is a diagram of a circuit that shows the initial offset compensation of an amplification elementary cell.

A variant of this implementation permits taking into account the intrinsic drift induced by the offset at the origin. Consequently, according to the embodiment illustrated in FIG. 12, a compensation signal COMPi is added to the amplified signal AMPLIi in order to reduce or eliminate the impact of the offset.

This signal is generated by circuit 162 from a VREF signal according to the formula VREF*R2/(R2+R'2), which can be either the feed voltage of the different VALIM modules, or an external signal.

The cell gain as defined above and is modified and defined according to formula G=2*(R2/R'2)/R1.

This principle requires knowing the offset with sufficient accuracy at the origin of the transducers which are used to adjust as best as possible the parameters like VREF, the gains and resistances of amplifier 161.

The GMR units present on each strip 100 can in certain cases show a dispersion which is much too large to find an average compensation value for each of the paths.

In this case, one can then extend the principle by introducing a floating ground where the AMPLIi output signal will no longer be referenced with respect to the common ground of the modules, but to a floating ground determined by the mid-point of the measuring bridges (Wheatstone bridge type) 163 in which enter the GMR cells, such as those of FIGS. 4 and 5, or by a polarization point other than the mid-point, with the latter allowing for a simpler embodiment.

Figure 13:
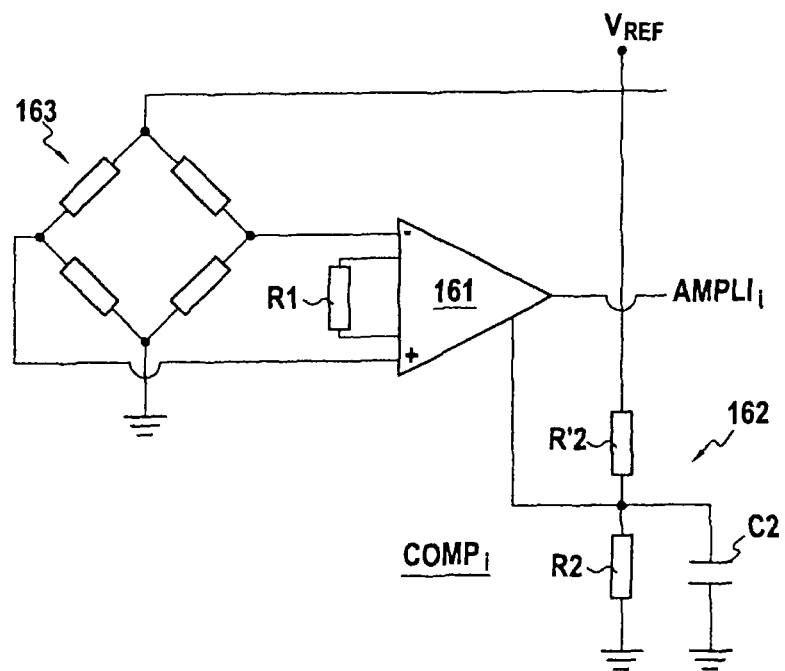
FIG. 13 is a diagram of a circuit that shows the mid-point compensation.

This embodiment is illustrated by FIG. 13. The direction and the value of the offset are then not too constraining.

An innovative aspect of this mode of operation permits to measure the GMR variations independently from the direction of the field found. This eliminates the effect of the positioning in which the GMR orient themselves by their implantation, and also the voltage actually applied to the battery cell.

It is known that the presence of negative voltages on the battery cells appears during certain operating stages of the cell, in particular when starting the fuel cell (reagent supply), which often occurs in automotive applications.

Compensation value COMPi is set at VREF/2 since resistors R2 and R'2 are equal, with VREF either being an external reference or simply the Vdc feed voltage of the different modules. Alternatively, the gain is divided by 2.

Assuming an offset between −60 mV and +60 mV and a dynamic between −80 mV and +80 mV, one arrives at an excursion of the bridge signal between −140 mV and +140 mV. If one considers that VREF=VDC=3.3V (common voltage for typical electronic technologies), the excursion of the amplified signal is equal to 1.65. Then, one approaches a gain of 10-12, but it can be higher, for example 30.

Another important aspect of this invention relates to the miniaturization of the sensors, and in particular, strip 100 which groups the 8 paths.

Integration in the form of an encapsulated hybrid system, or SIP (System in Package) of the different components shown in FIG. 8 is a first technological miniaturization stage. Three-dimensional design techniques with printed circuit stacking are used with the signal exchanges taking place on the sections.

This way, a first printed circuit containing GMR strip 100 and instrumentation amplifiers 201 to 208 is created. The signal paths are grouped on the sections. The cutout printed circuit is placed in a gold frame.

Then, a second printed circuit containing multiplexers 300 (such as modules U25 to U31 of FIG. 11) is created. Here also, the signal paths are grouped on the sections. The cutout printed circuit is also placed in a gold frame.

These two printed circuits are then assembled; molded and encapsulated. The signal paths on the sections are then linked to input-output pins representing the connecting device 401, 402 of FIG. 8.

Such an embodiment permits having the instrumentation as close as possible to strip 100, thus minimizing the external noise sources, which originate mainly from the connections.

This implementation produces encapsulated hybrid systems ready to be associated with 8 battery cells (for the case of a strip 100 with 8 instrumented GMR cells).

Needless to say, this encapsulated hybrid system can be extended to fuel cells or to any other power generator containing multiple cells.

In particular, this can be applied to batteries containing for instance 120 cells for which measurements of at least twice per second are required.

Technologies used for the manufacture of the GMR strips match or are similar to those used for the manufacture of more classic electronic components. Consequently, a company specializing in this field can easily make small scale production of hybrid systems with an acceptable dispersion of calibrated strip sets, since most of the other SIP components are discreet components.

For example, a cluster of 15 hybrid systems has been designed and implemented on a PCB support card to cover the 120 paths of a fuel cell.

A portion of the electronics can then be shared among the various systems taking into account these constraints according to the elementary diagram of FIG. 8.

A processing module 400 that provides for data exchanges with the hybrid systems is shown in FIG. 8 and includes at a minimum:

- A processing unit 405,
- TOR type inputs-outputs 404,
- Analog inputs,
- Analog-digital converters 403,
- Optimally, a communication unit for communication with a remote entity, for example, a CAN protocol communication in an automotive application,
- A multi-layered printed circuit providing for all of the connections between the hybrid systems and the processing unit.

The component selected for implementing the processing system 400 can for instance have two analog-digital converters and provide for the almost-simultaneous conversion of an element of each hybrid system (this being 15 paths).

The simplified operating principle is as follows:

- Upon solicitation of an input-output triplet <S1, S2, S3>,
- Selection of an AMPLIi signal per strip (as such one GRM cell, and as such one voltage delivered by a battery cell). As such, there are 15 signals present on the different converters of the component.
- Reading and analog-digital conversion by CAN 403 of the 15 signals present:
- Storage of the converted values;
- Application of the processing software on all the data;
- Formation of the grid grouping the 120 values read and processed;
- Transmittal of the grid on the CAN bus.

The contained dispersion of the resistor bridges or of the current lines of the GMR strip can be corrected by calibrating of each of the paths.

To do that, each cell is emulated by a reference voltage source in a specified voltage range (typically from −1.2 to +1.2 V). Since the GMR response is almost linear, in theory two calibration points per GMR cell suffice, taken at the extremities of the voltage measurement range.

In practice, taking into account the dispersions but above all the offsets at the origin, seven points have been used. This has permitted refining the linearity of the measurement points observed and eliminating non-linear areas (saturation).

One can also optimize by integrating the weak dispersions tied to temperature in the −20° C. to 80° C. range.

By considering that the GMRs operate in their linear zone, calibration consists in measuring several couples <voltage applied to the GMRCELL cell, binary value converted by the analog/digital VBIN converter>.

By linear extrapolation, coefficients Ai and Bi corresponding to these measurements are calculated.

The equation can be written as: $VCELLi = Ai*VBINI + Bi$, with VCELLI being called the reconstituted voltage value.

A table grouping the 120 coefficients Ai and Bi is created. Then, the table is stored the processing software, or in an external file read by the processing software.

The processing software makes this calculation and consequently provides reconstituted battery cell voltages. On the basis of their application, other types of processing can be applied to these reconstituted data (averaging, thresholding, . . . ), enabling a diagnostic about the status of the cells and a follow-up for the measurement of their aging.

These different processes can lead to the generation of various result grids (cell status data, reconstituted voltages, . . . ) which are then issued from CAN ports to the vehicle control-command.

The application shown above enables the measurement of voltage coming from fuel cells between 0 and +1.2 V, while allowing a negative voltage reading.

Reading of higher cell voltages, such as for instance the battery cell voltages, around 3.6 V or greater (6 V), is not directly possible with these hybrid systems. The technology selected for the GMR cells does not permit such measurement without major risk of accelerated aging, or even destruction.

Figure 14:
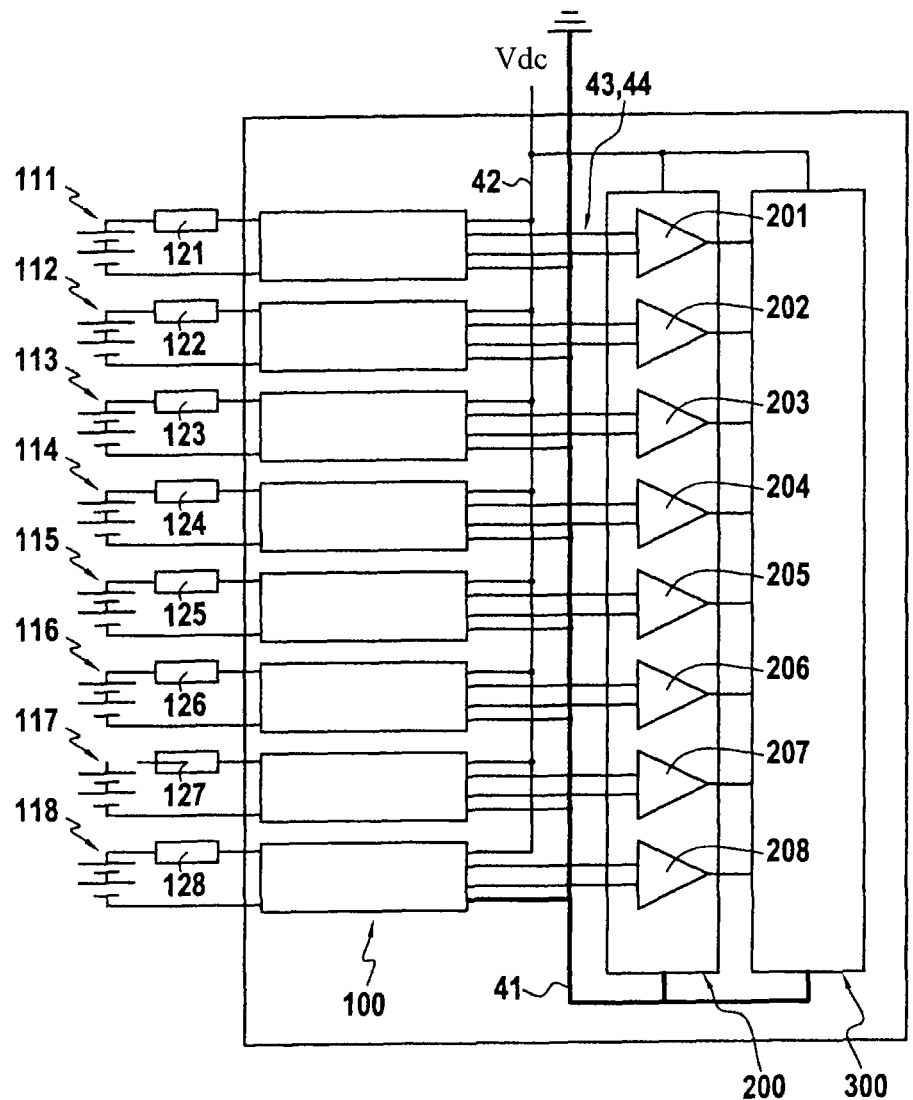
FIG. 14 is a variant of the synoptic diagram of FIG. 8 that permits an adaptation at higher cell voltages.

A simple and functional approach can be applied to the hybrid system to respond to these voltage levels. An adapted resistor 121 to 128 is inserted between the cell voltage measuring points and the corresponding input of the hybrid system as is shown in FIG. 14. It is a resistive divider with the resistance of the current line. The choice of this input bridge resistor is determined by the measurement range delivered by the battery cells. In any event, the selection of the resistor will take into account the line resistor (defined from the maximum derived current of 20 mA at 1.2 V, or around 50 ohms), the overall sensitivity expected for the hybrid system and heat dissipation that it will create (excluding the chip).

Of course, one can also redefine the current line by adapting it to the measured voltages, but this assumes making SIP components dedicated to voltage measurement ranges and it will be necessary in the design of the component, to take into account the overall heat dissipation inside the chip in this context. The embodiment of FIG. 14 however allows the same basic hybrid modules to be adapted easily to higher cell voltage levels.

The development of GMR magnetoresistor current sensors provides very integrated solutions that have an unequaled resolution. The integrated galvanic isolation allows 10 μA resolutions, while known embodiments are located in the area of mA or even 10 mA. The auto-fuse functions are beneficial features that can also be implemented with this invention.

Finally, the integration of several ways of multiplexing with address decoding in the same module as the amplification portion, is also a considerable improvement with respect to existing systems.

The GMR technology shows the following interests, among others, in addition to those already listed above in reference to the GMR and TMR technology:

- Voltage measurement card enabling the measurement of the fuel cell system (PAC) and optimization and security of the PAC system control/command,
- A system that provides the battery with an intelligent sensor accessible by all computers through a CAN network for the automotive application considered as an important application of this invention,
- Modularity of the GMR electronic components (1 SIP GMR includes 8 GMR bridges (cells) for measuring 8 voltages).

The invention claimed is:

1. A magnetoresistor integrated sensor for measuring voltage or current, comprising first and second terminals for connection to a generator for which the voltage or current is to be measured, linked to a metal measuring line through which flows a current proportional to the voltage or current of the generator which is to be measured, and at least two magnetoresistors for measuring the magnetic field created remotely by said current flowing through such measuring line, wherein the metal measuring line includes at least first and second elongated and parallel sections through which the current flows in opposite directions, connected to a section aimed at closing the measuring line, with the metal measuring line unit being arranged on one of the faces of an integrated galvanic isolation layer for voltages higher than or equal to 1500 V, with said integrated galvanic isolation layer being itself arranged on a section of the integrated detection circuit, said portion of the integrated detection circuit includes at least two magnetoresistors which themselves each have a sensitive section that is essentially superimposed onto one of the elongated sections of the metal measuring line in order to be sensitive to the field created by the current flowing through the measuring line and in that each of the first and second elongated sections of the metal measuring line comprises a narrowing or constriction in a zone near a zone superimposed onto a liaison path to a ground contact, on the side of said first and second terminals, said constrictions being used as an integrated fuse in case of an isolation defect created by an overvoltage peak.

2. The integrated sensor according to claim 1, wherein the metal measuring line unit is directly deposited onto one of the faces of the integrated galvanic isolation layer and directly opposite the sensitive part of the magnetoresistors deposited directly on the other face of the integrated galvanic isolation layer so that only the thickness of this isolation layer separates the measuring line from said sensitive part.

3. The integrated sensor according to claim 1, wherein the magnetoresistors are giant magnetoresistors.

4. The integrated sensor according to claim 1, wherein the magnetoresistors are tunnel magnetoresistors.

5. The integrated sensor according to claim 1, wherein said part of the integrated detection circuit includes a magnetoresistive bridge and connection paths to at least one Vdc voltage polarization contact, a ground contact and negative Vin− and Vin+ positive pole contacts of a differential output voltage.

6. The integrated sensor according to claim 1, wherein the magnetoresistors each have a C shape with a central longitudinal branch which constitutes said sensitive part that is essentially superimposed onto one of the elongated sections of the metal measuring line in order to be sensitive to the field created by the current that flows through the measuring line.

7. The integrated sensor according to claim 3, wherein each of the giant magnetoresistors have a length between 100 and 500 micrometers and a width between 2 and 8 micrometers.

8. The integrated sensor according to claim 4, wherein each of the tunnel magnetoresistors has a free layer in the shape of a C with a length between 40 and 150 pm and a width between 2 and 8 μm and a hard layer consisting of one or two blocks for which the size is adjusted to obtain resistances between 300 ohm and 10 Kohm.

9. The integrated sensor according to claim 1, wherein the metal measuring line has a resistance between 30 and 100 ohm.

10. The integrated sensor according to claim 1, wherein the first and second elongated sections of the metal measuring line have a width comparable to that of the sensitive parts of the magnetoresistors.

11. The integrated sensor according to claim 1, wherein the galvanic isolation layer is flat and has a thickness between 5 and 15 micrometers.

12. The integrated sensor according to claim 1, wherein the galvanic isolation layer is made up of a hardened resin deposit and includes a polyimide or bisbenzocyclobutene (BCB).

13. The integrated sensor according to claim 1, wherein the galvanic isolation layer is made up of a deposit of ceramic insulating material and includes a layer of Si3N4 or of Al2O3.

14. The integrated sensor according to claim 1, wherein the sensor is applied for the measurement of the voltage or current of a generator comprising a fuel cell having an output voltage between 0 and 1.3 V.

15. A voltage or current measurement diagnostic system for a power generator comprising a hybrid measurement module comprising multiple integrated giant magnetoresistor sensors for measuring voltage via a current or for measuring current according to claims 3, integrated on one and the same strip, an amplification module comprising multiple amplifiers receiving signals by said multiple sensors, a multiplexing module, a connection device and a separate digital processing module.

16. The system according to claim 15, wherein the hybrid measurement module comprises a first printed circuit containing said strip of sensors and the amplification module and a second printed circuit containing the multiplexing module, signal exchange paths formed on the printed circuit sections, and the first and second printed circuits being assembled, molded and encapsulated with the input-output connection terminals connected to said signal exchange paths formed on the printed circuit sections and connected to said liaison device.

17. The system according to claim 1, wherein the processing module includes at least one processing unit, analog inputs and analog-digital converters, TOR inputs-outputs of the all or nothing type and a printed circuit that provides for all of the connections between the hybrid measurement module and the processing module.

18. The system according to claim 15, wherein each integrated giant magnetoresistor sensor for measuring voltage or current includes first and second terminals for connection to an individual cell of the generator of which the voltage or current is to be measured and a metal measuring line, with such line comprising first and second elongated and parallel sections in which the current flows in opposite directions, connected to a section aimed at closing the measuring line; the metal measuring line unit being arranged on a galvanic isolation layer, itself arranged on an integrated circuit section comprising a bridge of giant magnetoresistors and liaison paths to at least one Vdc voltage polarization contact, one ground contact and negative Vin− and positive Vin+ pole contacts of a differential output voltage, with the giant magnetoresistors being themselves C-shaped with a central longitudinal branch forming a sensitive section of the magnetoresistor which is essentially superimposed onto one of the elongated sections of the metal measuring line.

19. The system according to claim 15, further comprising a resistor arranged between a measuring point of each power generator cell and the input terminal corresponding to the sensor strip.

20. The system according to claim 15, wherein each strip includes eight integrated giant magnetoresistor sensors for measuring voltage or current, the amplification module also includes eight amplifiers and the multiplexing module includes at least three stages of seven elementary multiplexing cells activated by three selection signals.

21. The system according to claim 15, wherein an initial offset compensation circuit is associated with each amplifier.

22. The system according to claim 15, wherein a compensation circuit of the polarization point determining a floating ground is associated with each amplifier.

* * * * *